(12) United States Patent
Gronenborn et al.

(10) Patent No.: US 12,034,275 B2
(45) Date of Patent: Jul. 9, 2024

(54) ENERGY EFFICIENT LASER ARRANGEMENT

(71) Applicant: TRUMPF Photonic Components GmbH, Ulm (DE)

(72) Inventors: Stephan Gronenborn, Ulm (DE); Holger Joachim Moench, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 957 days.

(21) Appl. No.: 16/919,149

(22) Filed: Jul. 2, 2020

(65) Prior Publication Data

US 2020/0335944 A1 Oct. 22, 2020

Related U.S. Application Data

(63) Continuation of application No. PCT/EP2019/050051, filed on Jan. 3, 2019.

(30) Foreign Application Priority Data

Jan. 5, 2018 (EP) .................................... 18150469

(51) Int. Cl.
*H01S 5/183* (2006.01)
*H01S 5/42* (2006.01)
*H01S 5/042* (2006.01)

(52) U.S. Cl.
CPC .......... *H01S 5/18391* (2013.01); *H01S 5/423* (2013.01); *H01S 5/042* (2013.01)

(58) Field of Classification Search
CPC ...... H01S 5/18391; H01S 5/423; H01S 5/042; H01S 5/0207; H01S 5/18386; H01S 5/18388

See application file for complete search history.

(56) References Cited

U.S. PATENT DOCUMENTS 6,285,503 B1 * 9/2001 Chao .................... G02B 5/0252
430/4
10,025,106 B2 7/2018 Mitra
(Continued)

FOREIGN PATENT DOCUMENTS

CN 105190398 A 12/2015
EP 0488772 A1 6/1992

*Primary Examiner* — Yuanda Zhang
(74) *Attorney, Agent, or Firm* — LEYDIG, VOIT & MAYER,LTD.

(57) ABSTRACT

A laser arrangement includes a laser array including a plurality of Vertical Cavity Surface Emitting lasers and an optical structure including a diffuser arranged to change a distribution of the laser light. The optical structure is configured to transform the laser light to transformed laser light such that an overlap of the emission cones of at least a group of the plurality of lasers is increased in field-of-view in comparison to perfectly collimated laser light diffused to a flat-top intensity profile in the field-of-view. The optical structure is arranged to redirect the laser light emitted at angles of the emission cone to the field-of-view so as to increase the overlap of the emitted laser light in the field-of-view. The optical structure is also configured to provide a slope angle α of an intensity profile along a direction of the field-of-view that is smaller than a divergence angle of the laser.

14 Claims, 9 Drawing Sheets

(56) References Cited

U.S. PATENT DOCUMENTS

| | | | |
|---|---|---|---|
| 2007/0071056 A1* | 3/2007 | Chen | G01S 17/42 372/50.124 |
| 2016/0164261 A1* | 6/2016 | Warren | H04N 23/11 372/50.122 |
| 2016/0197452 A1 | 7/2016 | Mor | |
| 2016/0311230 A1 | 10/2016 | Möench et al. | |

* cited by examiner

ENERGY EFFICIENT LASER ARRANGEMENT

CROSS-REFERENCE TO PRIOR APPLICATIONS

This application is a continuation of International Patent Application No. PCT/EP2019/050051, filed on Jan. 3, 2019, which claims priority to European Patent Application No. EP 18 150 469.7, filed on Jan. 5, 2018. The entire disclosure of both applications is hereby incorporated by reference herein.

FIELD

The invention relates to a laser arrangement, a lighting device comprising such a laser arrangement, a time-of-flight camera comprising such a lighting device and a method of manufacturing the laser arrangement.

BACKGROUND

Laser arrangements comprising, for example, a Vertical Cavity Surface Emitting Laser (VCSEL) array can be used for infrared illumination devices. Using short pulses VCSEL arrays are, for example, applied in time-of-flight applications. Such applications comprise e.g. short-range gesture recognition for portable devices and 3D space recognition. VCSEL arrays of about 1 mm² area with output power in the 1-10 W range are discussed for such applications. A specific field of illumination or view is defined by the application (e.g. a time-of-flight camera observing e.g. 70°×50°).

US 20016/0197452 A1 discloses an exemplary structured-light projector.

In the different technical field of laser printing, US 2016/0311230 A1 discloses a laser printing system for illuminating an object moving relative to a laser module of the laser printing system.

EP 0 488 722 A1 discloses a high-density radiation-emitting semiconductor array comprising disordered regions extending through a confinement layer, an active layer and partially into another confinement layer to define light-emitting regions between the disordered regions.

SUMMARY

In an embodiment, the present invention provides . . . .

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
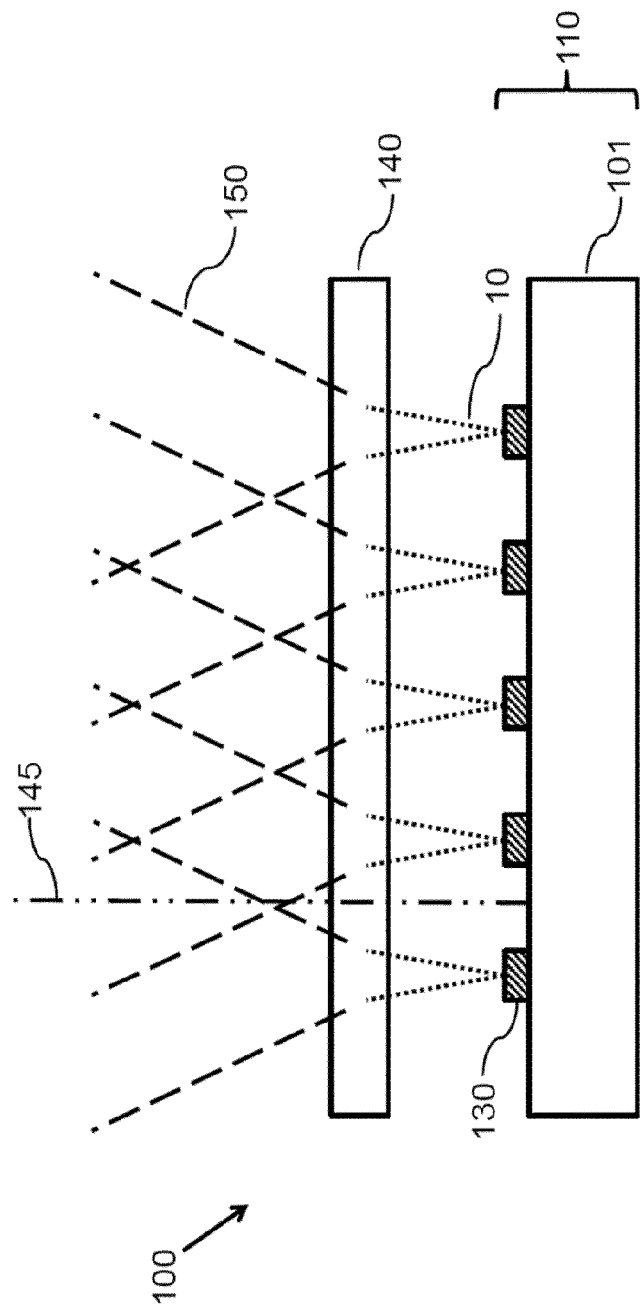
FIG. 1 shows a principal sketch of a cross-section of a first laser arrangement.

It is an object of the present invention to provide a laser arrangement enabling a more efficient use of laser light emitted by a laser array, especially, a VCSEL array comprised by the laser arrangement.

The claimed subject matter is defined in the independent claims. Preferred embodiments are described in the dependent claims or are described in the subsequent portions of the description.

According to a first aspect is a laser arrangement provided. The laser arrangement comprises a laser array and an optical structure for providing a defined illumination pattern in a defined field-of-view provided. The optical structure comprises a diffuser arranged to change a distribution of laser light emitted by lasers comprised by the laser array. Each laser is during operation characterized by an emission cone comprising essentially all laser light emitted by the respective laser. The emission cone is given by the solid angle in which the intensity of the emitted laser light is larger than full angle half maximum of the maximum intensity. The optical structure is arranged to transform the laser light to transformed laser light such that an overlap of laser light comprised by the emission cones of at least a group of lasers comprised by the laser array is increased in the field-of-view because of the transformation to transformed laser light in comparison to a diffuser which is arranged to diffuse perfectly collimated laser light to a flat-top intensity profile in the field-of-view. The optical structure may be arranged to redirect the laser light emitted at large angles of the emission cone to the field-of-view. The lasers may be Vertical Cavity Surface Emitting Lasers (VCSEL) or side emitters. The optical structure may be further arranged to increase the overlap of the emitted laser light in the field-of-view such that an intensity of the defined illumination pattern varies in the field-of-view less than 20%, more preferably less than 10% and most preferably less than 5% with respect to a reference intensity pattern in the field-of-view. The optical structure is arranged to provide at least 80%, more preferably at least 90% and most preferably at least 95% of the laser light emitted by the VCSEL array in the field-of-view. The total improvement depends on the angular extension of the field-of-view in relation to the divergence angle of the lasers.

State-of-the-art cameras and especially time-of-flight (TOF) have a wide viewing angle and use diffusers to achieve a homogenous irradiance on the scene. In the best case, the diffuser creates a perfect flat-top profile matching exactly the field-of-view of the camera. However, the divergence angle of a VCSEL (typically 20 full-angle) broadens and smears out the diffuser profile resulting in slopes at the edges of the illumination profile or pattern. The slope angle(s) at the edges of the illumination profile are the same as the divergence angle(s) of the VCSEL (see FIG. 2 and FIG. 3). Either the slopes are outside the field-of-view and are lost energy (10% to 50%, depending on the ratio of divergence angle of the VCSEL to diffusion angle) or they result in darker edges of the camera image with a low signal and thus reduced measurement accuracy. Alternative approaches as, for example, focusing each VCSEL by means of a microlens may be more energy efficient but may be very sensitive with respect to failure of single VCSELs.

The proposed laser arrangement may in particular enable a homogeneous and reliable light distribution by means of an improved overlap of a multitude of the VCSELs (in an extreme case all VCSELs) in the field-of-view. The optical structure tunes angular dependence of the emission pattern to provide an intensity distribution near to the intended reference intensity pattern and reduces losses at the edges of the field-of-view. The optical structure is arranged to transform the laser light emitted with a given emission cone (which is characterized in case of circular symmetry (e.g. VCSEL) by one divergence angle) to transformed light such that a slope angle of the intensity distribution in the field-of-view is smaller than the divergence angle of the lasers. The optical structure may be arranged to redirect the laser light emitted at large angles of the emission cone to the field-of-view. The optical structure may especially be arranged to redirect the laser light such that a degree of redirection to the field-of-view increases with increasing angle within the emission cone of the lasers.

The reference intensity pattern may be selected out of the group constant intensity in a reference plane in the field-of-view, constant intensity with respect to the solid angle defined by the field-of-view and increased intensity in a rim of the field-of-view for compensating optical losses of an optical device arranged to image the defined illumination pattern to an image area such that the intensity distribution in the image area is constant. The reference intensity pattern with increased intensity in a rim of the field-of-view is in fact a special case of the constant intensity distribution because the intended intensity distribution in the field-of-view taking into account the optical losses of the additional imaging optics is a constant intensity distribution. A cross-section of such reference intensity patterns along one dimension of the two-dimensional field-of-view are discussed with respect to FIG. 4. The angular extension of the reference intensity pattern may be different along the second dimension. The optical structure is arranged to improve projection of light emitted at large angles to the defined field-of-view in order to provide the defined illumination pattern.

The diffuser may according to one embodiment be arranged to transform the laser light to the transformed laser light. Each VCSEL is characterized by an emission cone with a maximum divergence angle $\theta_2$. The maximum divergence angle $\theta_2$ is in case of a rotationally symmetric emission cone the full-angle (typically 20°) as discussed above. The diffuser may in this embodiment be arranged to redirect the laser light emitted at large angles (especially at the outer rim of the emission cone comprising the laser light emitted by the laser under an angle which may, for example, be between the divergence angle and divergence angle—10%) of the emission cone to the field-of-view.

The diffuser may in one embodiment arranged at a distance to light-emitting surfaces of the VCSELs such that the emission cones of the VCSELs do not overlap in a plane of the diffuser. The diffuser comprises at least two different segments per VCSEL. The at least two different segments are characterized by a different diffuser structure. Each segment is arranged to redirect laser light received by the respective segment to the field-of-view. Two, three, four or more segments may be arranged to increase overlap of the transformed light in the field-of-view to get the defined illumination pattern. The diffuser structure may continuously change across the emission cone of the respective VCSEL to increase the overlap of the emitted laser light.

Each segment of the diffuser may especially be arranged to redirect the laser light received by the respective segment in a direction of a surface normal to a light exit area of the diffuser (identical with surface normal to a plane of the VCSEL array in case of a planar diffuser) depending on an angle of the laser light within the respective emission cone with respect to the surface normal such that an overlap of the transformed laser light in the field-of-view is increased. Each segment of the diffuser may especially be arranged such that a degree of redirection increases with increasing angle of the emitted laser light within the respective emission cone with respect to the surface normal.

The distance between the light emission surfaces of the VCSELs determines a range of angles within the maximum divergence angle $\theta_2$ of an emission cone of one VCSEL which is associated with one segment of the diffuser. This range of angles defines a main or average emission direction of the respective VCSEL with respect to the associated segment of the diffuser. Each segment of the diffuser is characterized by a respective emission cone with a main emission direction of the segment. Laser light emitted by the respective VCSEL is transformed by the diffuser or more specifically by the respective segment of the diffuser such that a main emission direction of laser light received by the respective segment of the diffuser is tilted in the direction to the surface normal to the light exit area of the diffuser. The main emission direction of laser light received by the segments of the diffuser may preferably be tilted such that the corresponding emission cone of the segment is characterized by a main emission direction which is essentially parallel to the surface normal. Laser light emitted at a large angle (within the boundary condition given by the maximum divergence angle $\theta_2$) is transformed such that the main emission direction of the corresponding segment is essentially directed to the field-of-view.

The diffuser may alternatively be arranged at a distance to light-emitting surfaces of the VCSELs such that the emission cones of a multitude of VCSELs overlap. The diffuser comprises at least two different segments. Each segment is arranged to direct laser light received by the respective segment to the field-of-view. The diffuser is in this case again arranged such that laser light emitted at a large angle is redirected to the field-of-view. The laser light emitted in a defined range of angles comprises in this embodiment laser light emitted by a two, three, four or more VCSELs.

The distance to the light-emitting surfaces of the VCSELs may be such that each segment of the diffuser receives laser light from the VCSEL array within a predefined range of angles with respect a surface normal to the light exit area of the diffuser. A lateral extension of the VCSEL array has therefore to be small with respect to the distance to a light entrance surface of the diffuser. The distance may, for example, be around 1 cm in case of a VCSEL array with a size of 1 mm×1 mm.

The optical structure may alternatively or in addition comprise an optical device. The diffuser is arranged to diffuse the laser light received from the VCSELs. The diffuser has a light exit area through which the diffused laser light leaves the diffuser. The optical device comprises a light entrance window for receiving the diffused laser light. The optical device is arranged to redirect the diffused laser light to the field-of-view such that the laser light is transformed to the transformed laser light. The light entrance window has preferably the same size as the light exit area. The adaption of the size of the light entrance window and the light exit area minimizes optical losses and enables optimized adaption of the redirection properties of the optical device.

The optical device may comprise tilted mirrors. A tilt angle of the tilted mirrors is defined with respect to a surface normal to a light exit area of the diffuser. The tilt angle is arranged to provide the intensity of the defined illumination pattern. The tilt angle may depend on the diffuser profile (emission profile of the diffuser) of the diffuser. There may be two different tilt angles in case of a, for example, rectangular diffuser profile.

Each emission cone may be characterized by a maximum divergence angle $\theta_2$ as described above. An angle of extension of the field-of-view in one direction may be given by $\theta_1$. The tilt angle is given by $\theta_G=\theta_1/2+/-5°$, more preferably $\theta_1/2+/-3°$ and most preferably $\theta_1/2+/-1°$ in the direction of the maximum divergence angle $\theta_2$. If the tilted mirror is long enough in the direction of the optical axis (parallel to the surface normal to the light exit area of the diffuser), all light with an angle greater than $\theta_G$ will be reflected to an angle smaller than $\theta_G$ and thus back into the field-of-view.

The VCSELs of the VCSEL array may be bottom emitters which are arranged to emit the laser light through the semiconductor substrate. The diffuser may in this case be provided on a light emitting surface of the semiconductor substrate. The diffuser may, for example, be integrated in at semiconductor structure of the VCSEL array. Alternatively, a structured transparent layer comprising the diffuser may be mounted on the light emitting surface of the semiconductor substrate.

According to a further aspect a light emitting device is provided. The light emitting device comprises at least one laser arrangement according to any embodiment described above and an electrical driver for providing an electrical drive current to the laser arrangement.

According to a further aspect a time-of-flight camera is provided. The time-of-flight camera comprises the light emitting device described above, an evaluator and a light detector for detecting transformed laser light reflected by an object. The evaluator is arranged to determine a distance to the object by means of the transformed laser light detected by the light detector.

According to a further aspect a method of fabricating a laser arrangement is provided. The method comprises the steps of:
providing a semiconductor substrate,
providing a laser array comprising a multitude of lasers on a first surface of the semiconductor substrate, wherein each laser is characterized by an emission cone,
providing an optical structure,
arranging the optical structure to transform laser light emitted by the lasers to transformed laser light such that an overlap of laser light comprised by the emission cones of at least a group of lasers comprised by the laser array is increased in a defined field-of-view in comparison to a diffuser which is arranged to diffuse perfectly collimated laser light to a flat-top intensity profile in the field-of-view.

According to a further aspect a method of illuminating a field-of-view is provided. The method comprises the steps of:
emitting laser light,
transforming the laser light to transformed laser light by means of an optical structure, wherein the optical structure comprises a diffuser, wherein the laser light is transformed such that an overlap of laser light comprised by the emission cones of at least a group of VCSELs comprised by the VCSEL array is increased in a defined field-of-view in comparison to a diffuser which is arranged to diffuse perfectly collimated laser light to a flat-top intensity profile in the field-of-view. The optical structure can arranged to redirect the laser light emitted at large angles of the emission cone to the field-of-view.

It shall be understood that the laser arrangement described above and the method of fabricating have similar and/or identical embodiments, in particular, as defined in the dependent claims.

It shall be understood that a preferred embodiment of the invention can also be any combination of the dependent claims with the respective independent claim.

Further advantageous embodiments are defined below.

These and other aspects of the invention will be apparent from and elucidated with reference to the embodiments described hereinafter.

The invention will now be described, by way of example, based on embodiments with reference to the accompanying drawings.

In the Figures, like numbers refer to like objects throughout. Objects in the Figures are not necessarily drawn to scale.

Various embodiments of the invention will now be described by means of the Figures.

FIG. 1 shows a principal sketch of a cross-section of a first laser arrangement 100. The first laser arrangement comprises a two-dimensional VCSEL array 110. The VCSEL array 110 comprises a multitude of VCSELs 130. The VCSELs are arranged on a common substrate 101. Each VCSEL 130 emits laser light 10 with a defined emission cone (see also discussion with respect to FIG. 5 in FIG. 6) to an optical structure 140. The optical structure comprises a diffuser (not explicitly shown). The optical structure 140 redirects at least parts (especially laser light 10 emitted at large angles within each emission cone) of the laser light 10 (transformed laser light 150) in a direction such that the transformed laser light 150 illuminates a defined field-of-view with increased efficiency. The technical advantage provided by the laser arrangement according to the present invention is described in more detail with respect to FIGS. 5 and 6.

Figure 2:
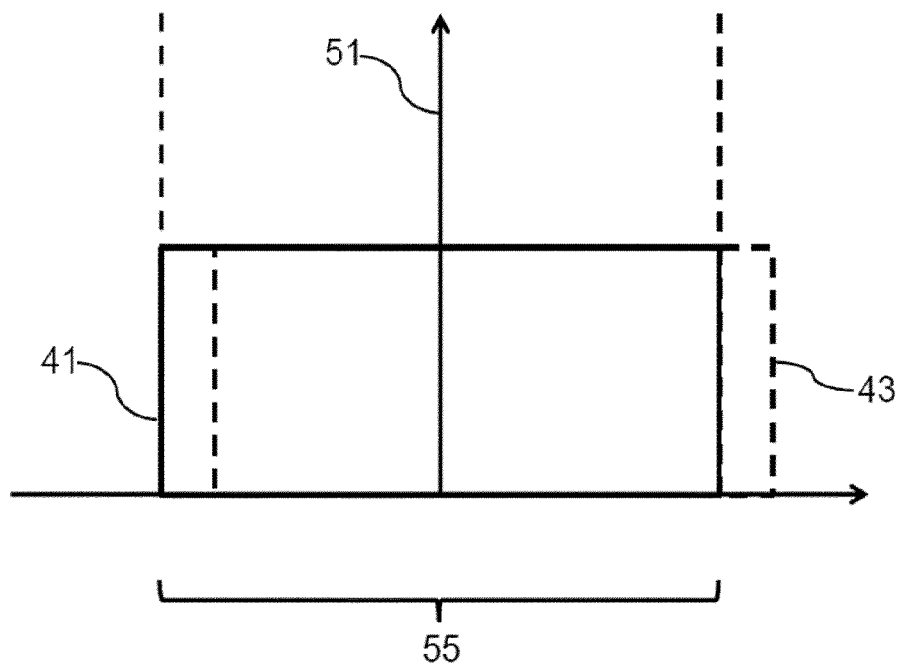
FIG. 2 shows examples of intensity distributions in a field-of-view depending on emission angle which can be provided by a prior art diffuser.

FIG. 2 shows examples of intensity distributions in a field-of-view depending on emission angle within an emission cone of the laser which can be provided by a prior art diffuser. The ordinate is assigned to the intensity 51 and the abscissa is assigned to the angle 53 along one direction of the field-of-view. Line 41 shows an intensity distribution of a prior art diffuser (see also FIG. 5) which diffuses perfectly collimated laser light received under an angle of 0° with respect to the surface normal of the prior art diffuser. The intensity distribution 41 is a perfect flat-top intensity distribution within the angular extension ($\theta_1$) of field-of-view in one direction 55. Line 43 shows an intensity distribution of the prior art diffuser which diffuses perfectly collimated laser light received under an angle of 10° with respect to the surface normal of the prior art diffuser. The intensity distribution 43 is again a perfect flat-top intensity distribution but shifted by the angle of reception of 10° such that a part of the laser light is outside of the field-of-view as indicated by the angular extension 55 in one direction.

Figure 3:
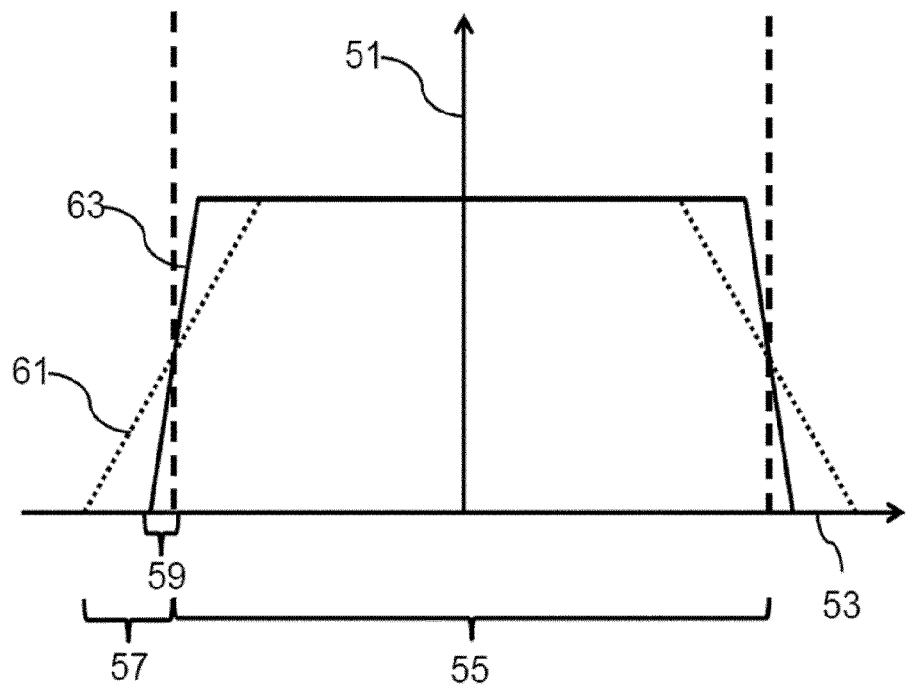
FIG. 3 shows examples of intensity distributions in a defined field-of-view.

FIG. 3 shows two examples of intensity distributions along one direction (e.g. x-axis) of one defined field-of-view. The dotted line 61 shows a prior art intensity distribution which can be provided by the prior art diffuser. The intensity distribution rises slowly reaches a flat plateau and declines slowly going from left to right. The prior art intensity distribution results from an overlap of a multitude of flat-top profiles resulting from the divergence of the laser light emitted by the respective laser or laser array as discussed with respect to FIG. 2. The illumination pattern therefore comprises a broad rim with changing intensity distribution. The rim is given by the divergence angle $\theta_2$ of the lasers, wherein half of the rim is arranged outside the angular extension 55 ($\theta_1$) of the field-of-view in the selected direction. The intensity distribution deviates at the edges therefore strongly from the intended flat reference intensity pattern (see first reference pattern 21 in FIG. 4). The light emitted outside the angular extension 55 and the corresponding energy of around 20% is therefore wasted. The solid line 63 shows an improved intensity distribution which can especially be provided, for example, by means of the embodiments of the laser arrangement 100 discussed above and below. The rim shrinks to angle 59 ($\alpha/2$—half reduced slope angle). The optical structure 140 of the laser arrangement 100 is therefore arranged to reduce the slope angle of the intensity distribution in the field-of-view such that the slope angle is smaller than the divergence angle of the laser or lasers in the corresponding direction. The laser arrangement 100 therefore improves the intensity distribution with respect to the intended reference intensity pattern within the angular extension 55 of the field-of-view. Furthermore, the light intensity outside angular extension 55 of the field-of-view is reduced and efficiency of the laser arrangement 100 is improved.

Figure 4:
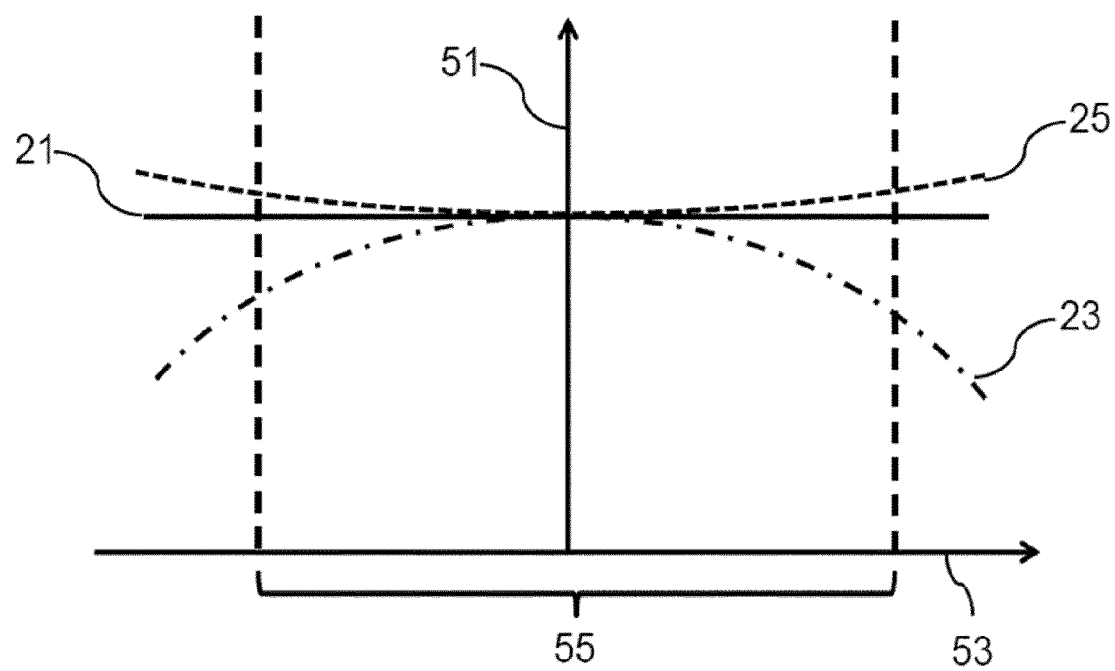
FIG. 4 shows examples of reference pattern.

FIG. 4 shows examples of reference intensity patterns. The ordinate is assigned to the intensity 51 and the abscissa is assigned to the angle 53 along one cross-section parallel to the surface of the illumination pattern in the field-of-view as discussed with respect to FIG. 3. The first reference intensity pattern 21 is a constant intensity in a reference plane in the field-of-view. The second reference intensity pattern 23 is defined by a constant intensity with respect to the solid angle defined by the field-of-view. The third reference intensity pattern 25 is in fact the special case of the first reference intensity pattern 21. The third reference intensity pattern 25 is characterized by an increasing intensity near to the edges of the field-of-view for compensating optical losses of an optical device arranged to image the defined illumination pattern to the field-of-view. The final intensity distribution of the laser arrangement in combination with the optical imaging device in the field-of-view is constant.

Figure 5:
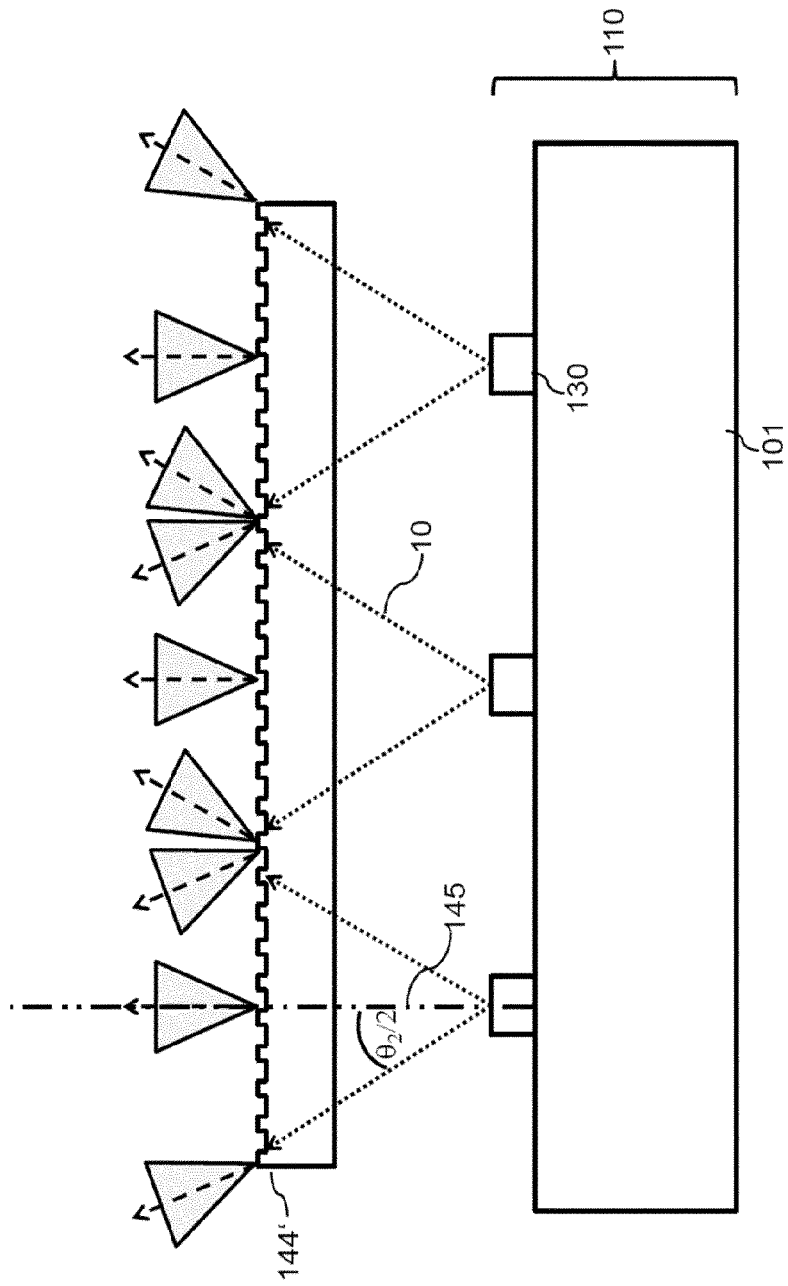
FIG. 5 shows a principal sketch of a cross-section of a prior art laser arrangement.

FIG. 5 shows a principal sketch of a cross-section of a prior art laser arrangement. The laser arrangement comprises a VCSEL array 110 as described with respect to FIG. 1. Each VCSEL 130 emits laser light with an emission cone characterized by a cone angle $\theta_2/2$ (half divergence angle $\theta_2$) with respect to a surface normal 145 to a light exit area of the diffuser 144'. The laser light 10 is emitted to a prior art diffuser 144'. The prior art diffuser 144' redirects the laser light 10 such that laser light 10 emitted at large angles within the emission cone is diffused to even larger angles. Laser light 10 received, for example, at the edges of one emission cone is diffused such that the main emission direction of the diffused light (indicated by the arrows) leaving the prior art diffuser 144' at the respective position is essentially the same as the direction of the laser light at the edge of the emission cone. The main emission direction is enclosed in an emission cone 135 characterized by a diffusion angle of the prior art diffuser 144'. The divergence angle $\theta_2$ of the VCSELs in combination with the diffusion properties of the prior art diffuser 144' causes the flat slope of the prior art intensity distribution 61 discussed with respect to FIG. 3.

Figure 6:
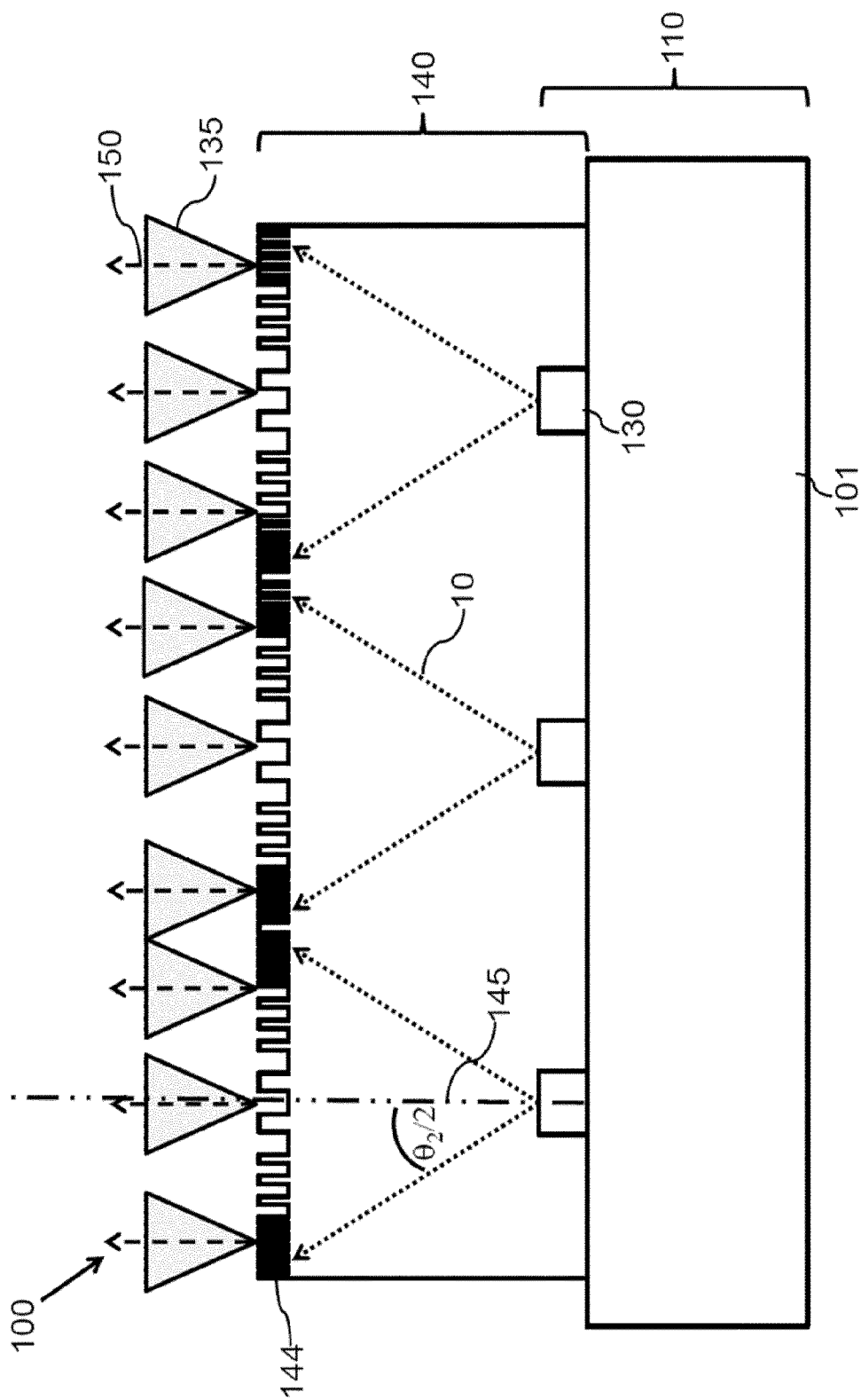
FIG. 6 shows a principal sketch of a cross-section of a second laser arrangement.

FIG. 6 shows a principal sketch of a cross-section of a second laser arrangement 100. The laser arrangement comprises a VCSEL array 110 as described with respect to FIG. 1. Each VCSEL 130 emits laser light with an emission cone characterized by a cone angle $\theta_2/2$ (half divergence angle $\theta_2$) with respect to a surface normal 145 to the light exit area of the diffuser 144. An optical structure 140 comprising a diffuser 144 is integrated on wafer level. A distance between light emitting surfaces of the VCSELs 130 and the diffuser 144 is arranged such that the emission cones of the VCSELs 130 do not overlap in a plane defined by the diffuser 144. The structure of the diffuser 144 changes across the emission cone of each VCSEL 130. The diffuser 144 comprises different segments which may be approximately infinitesimally small in case of a continuously changing diffuser structure. Laser light 10 emitted by the respective VCSEL 130 is transformed by the diffuser 144 or more specifically the respective segment of the diffuser such that a main emission direction of laser light 10 received by the respective segment of the diffuser 144 is tilted because of the interaction with the diffuser 144 in the direction to the surface normal 145 to a light exit area of the diffuser 144. The main emission direction of laser light 10 received by the segments of the diffuser 144 is tilted such that the corresponding emission cone of the transformed light 135 of the segment is characterized by a main emission direction (indicated by the arrows) of transformed light 150 which is essentially parallel to the surface normal 145. The tilt angle of the transformed light 150 increases with increasing angle (given by the boundary conditions of the divergence angle(s) $\theta_2$) of the laser light 10 received by the diffuser 144. The optical structure 140 reduces therefore in comparison to the prior art diffuser 144' discussed with respect to FIG. 5 the light intensity within the slope region of the intensity distribution pattern in the field-of-view. The part of the diffusor 144' comprising the different segments in front of each VCSEL 130 of the VCSEL array 110 is characterized by a size in the order of the pitch between the VCSELs 130. The distance d before the emission cones of the individual VCSELs overlap is typically between 100 µm and 500 µm depending on the pitch between the VCSELs. The diffuser structure of the diffuser 144 may according to an alternative laser arrangement 100 (not shown) be etched in a back surface of the (GaAs) substrate 101 if the laser arrangement 100 comprises bottom emitting VCSELs 130.

Figure 7:
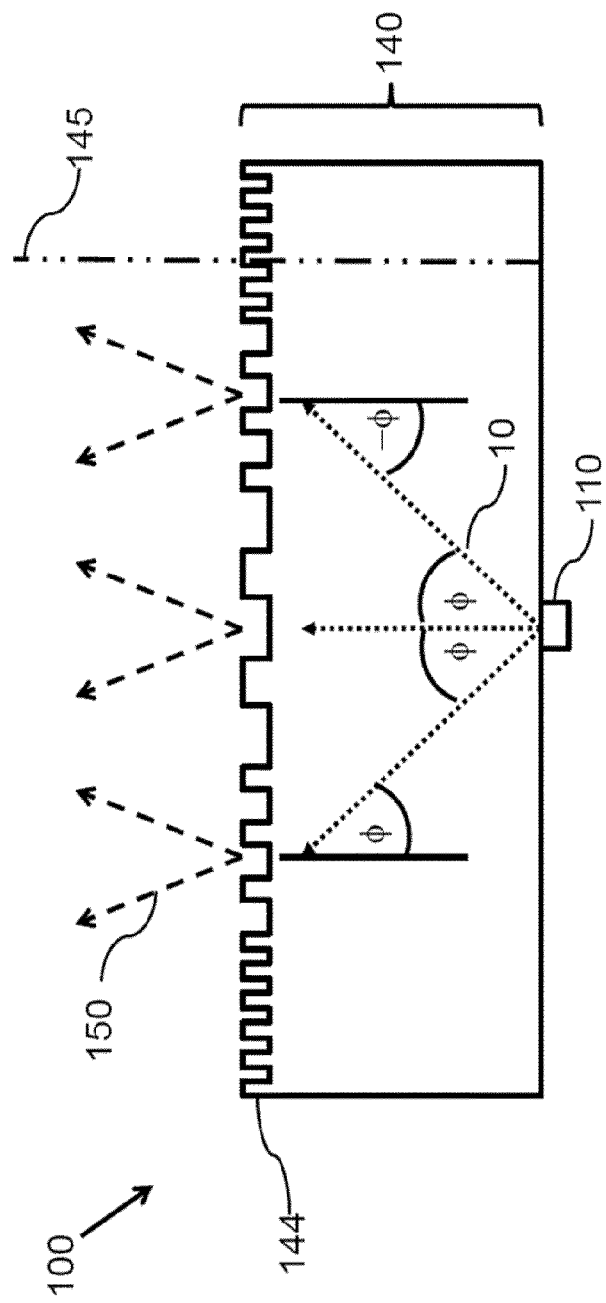
FIG. 7 shows a principal sketch of a cross-section of a third laser arrangement.

FIG. 7 shows a principal sketch of a cross-section of a third laser arrangement 100. The general principle is similar as discussed with respect to FIG. 6. The laser array 110 is mounted on a first side of a transparent block building optical structure 140 which comprises the diffuser 144 on a second side of the transparent block opposite to the first side. The difference is that the laser array 110 is small in comparison to the distance to the diffuser 144. Multiple emission cones of the VCSELs comprised by the VCSEL array 110 overlap in a plane of the diffuser 144. The distance between VCSEL array 110 and the diffuser 144 is chosen such that the laser light 10 emitted by the VCSEL array 110 and received by the diffuser 144 within a defined range of angles cannot be assigned to a single VCSEL 130. The VCSEL array 110 appears in an extreme case to be a single (approximately dot like) light source with respect to the diffuser 144 with a maximum divergence angle 2ϕ which is essentially the same light the divergence angle $\theta_2$ of the single VCSEL 130. The diffuser is again arranged such that laser light 10 received within a certain range of angles (e.g. between ϕ and ϕ−2° with respect to the surface normal 145 to the light exit area of the diffuser 144) is redirected in the forward direction (tilted in the direction of the surface normal 145) such that the overlap of the laser light 10 within the transformed light 150 is increased.

Figure 8:
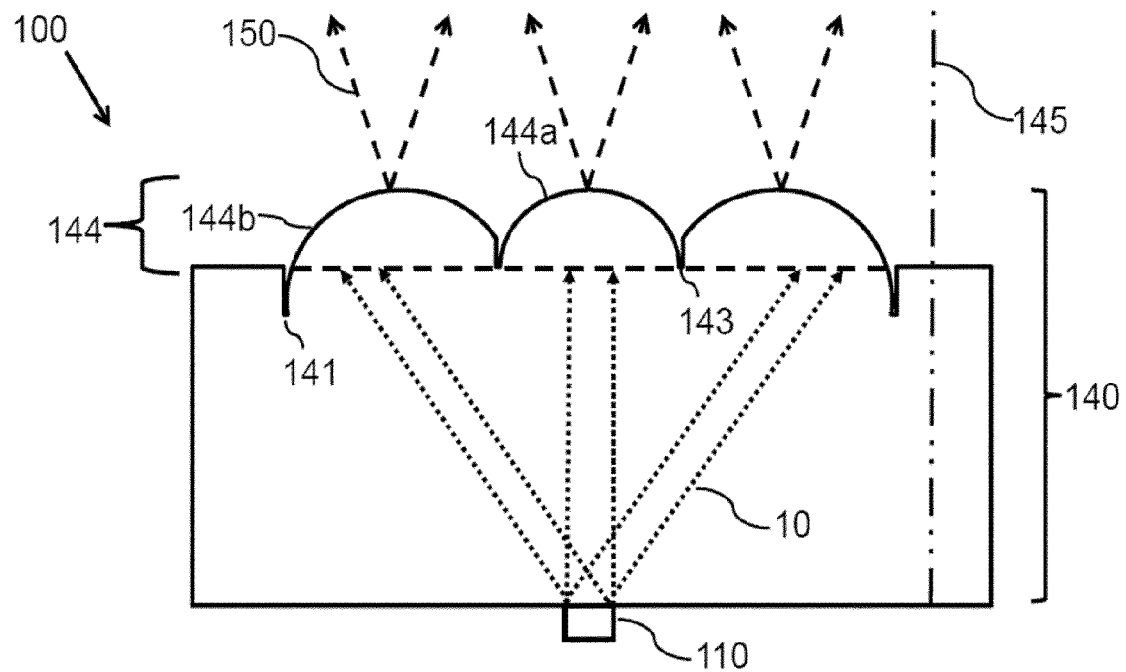
FIG. 8 shows a principal sketch of a cross-section of a fourth laser arrangement.

FIG. 8 shows a principal sketch of a cross-section of a fourth laser arrangement 100 describing a special case of the embodiment discussed with respect to FIG. 7. FIG. 8 is like the other Figures not drawn to scale. The diffuser 144 comprises in this embodiment a quite rough structure of two segments. The first segment 144a is a lens like structure which covers a range of angles between, for example, −50° and +50°. The second segment 144b is lens like structure arranged around the first segment 144a and covers, for example, on the left side a range of angles between −45° and 55° for light which is parallel to the surface normal 145 to the light exit area of the diffuser 144. This means that the left side covers for laser light 10 received under an angle of −5° an angular range between −50° and 50°. The second segment 144b is for this purpose decentered with respect to an axis through the center of the VCSEL array 110 and comprises an angular reduction 143 at a side next to the first segment 144a and an angular extension 141 at the outer rim of the second segment 144b away from the first segment 144a. The transformed light 150 is again redirected into the direction of the field-of-view. The diffuser 144 may be further improved by providing three, four, five or more segments covering smaller ranges of angles in order to increase the overlap of the laser light 10 in the field-of-view.

Figure 9:
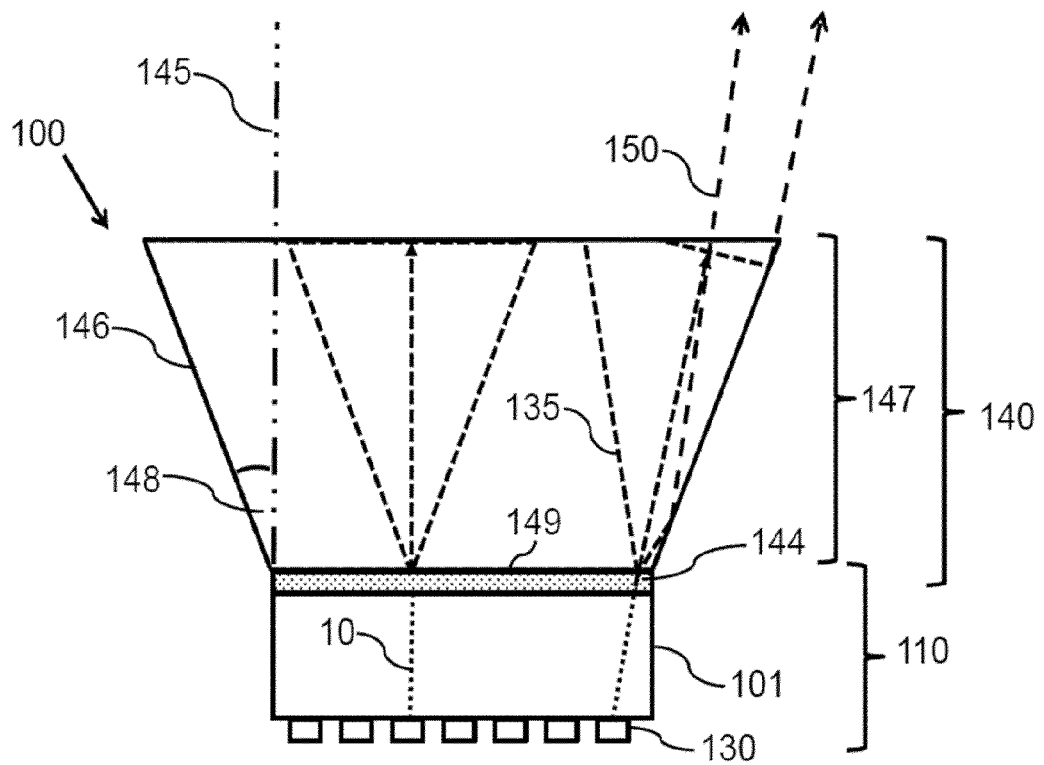
FIG. 9 shows a principal sketch of a cross-section of a fifth laser arrangement.

FIG. 9 shows a principal sketch of a cross-section of a fifth laser arrangement 100. The fifth laser arrangement 100 comprises an array 110 of bottom emitting VCSELs 130 arranged on a first side of a common substrate 101. The fifth laser arrangement 100 further comprises an optical structure 140 comprising a diffuser 144 which may be a prior art diffuser 144' as discussed with respect to FIG. 5 and an optical device 146. The diffuser 144 is attached to a second side of the common substrate 101 which is arranged opposite to the first side. Laser light 10 emitted by the VCSELs is diffused by means of the diffuser 144 as discussed with respect to FIG. 5 such that diffused light leaves a light exit area 149 of the diffuser 144. The optical device 146 comprises tilted mirrors which are arranged around a light entrance window of the optical device 146 which has essentially the same size as the light exit area of the diffuser 144. The tilted mirrors are characterized by a tilt angle $\theta_G$ 148 with respect to the surface normal 145 to the light exit area of the diffuser 144. If $\theta_1$ is again the desired full viewing angle 55 along one direction of the field-of-view, the full-width half maximum angle of the diffusor 144 has also to be $\theta_1$. The divergence of the VCSELs $\theta_2$ will smear out the illumination profile, resulting in slopes with a width of $\theta_2$ (see FIG. 3 and FIG. 5). The intensity will start decreasing at an angle $(\theta_1-\theta_2)/2$ with respect to the optical axis (parallel to surface normal 145) and decay to zero intensity at an angle of $(\theta_1-\theta_2)/2$ (see FIG. 3). The tilted mirrors have an angle of $\theta_G = \theta_1/2$. If the tilted mirror is long enough in the direction of the optical axis, all light with an angle greater than $\theta_G$ will be reflected to an angle smaller than $\theta_G$ and thus back into the field-of-view. In order to decrease the width of the slope from $\theta_2$ to an angle α (see improved intensity distribution 63 in FIG. 3), the height h of the diffusor 147 has to be h=a/(tan($\theta_G$+α/2)−tan($\theta_G$)), with "a" being the size of the opening between the two mirrors (extension of the light exit area 149 in this direction). The effect of the optical device 146 is indicated by the emission cone 135 of the diffused laser light. The tilted emission cone 135 of the diffuse laser light which results from laser light 10 which is emitted under an angle of, for example, 10° is partly reflected by the right side of the tilted mirror. The reflected part of the emission cone 135 is redirected to the field-of-view. The overlap of the emission cones of the laser light 10 which are comprised by the transformed light 150 is therefore increased in comparison to a prior art diffuser without optical device 146.

The embodiment discussed with respect to FIG. 9 is illustrated by means of the following example. The light exit area 149 may have a side length of a=1 mm and the desired viewing angle 55 in one direction may be $\theta_1$=90°. The VCSEL 130 has a typical full divergence angle $\theta_2$ of 20°. Without the tilted mirrors, the beam profile after the diffusor will have a full-width half-maximum equal to $\theta_1$=90° but with 20° slopes on both sides. Thus, the homogenous part of the profile is 20 smaller than the full-width half maximum, either resulting in dark edges of the camera image or >20% of lost energy outside the field-of-view if the diffusor angle is made large enough, that the field-of-view is illuminated homogenously. By adding the tilted mirrors with an angle $\theta_G$=45°, the slope can be reduced from 20° to 4° if the tilted mirrors have a height h=1 mm/(tan(45°+4°/2)−tan(45°)) of about 13.8 mm. the optical structure 10 comprising the diffuser 144 and the optical device 146 therefore avoids dark edges or most of the 20% of lost energy can be redirected in the field-of-view. Thus 20% less laser power is needed for the same signal strength in the intended application (e.g. camera). The benefit is even larger the smaller the ratio $\theta_1/\theta_2$ is and the larger the height h of the optical device 146 can be. The conditions may be different in the second direction in the field-of-view depending on the properties of diffuser 144 (e.g. a diffuser with rectangular emission profile) such that the tilt angle may be different in the second direction.

The tilted mirrors may alternatively be replaced by a solid block of a transparent material e.g. glass, PMMA, PC, Silicone, . . . with the diffusor structure on the bottom side and the four tilted (side) mirrors realized by flat side walls using, for example, total internal reflection. The cross section of the optical structure 140 will be trapezoidal-shaped in both directions with the entrance side having the diffusor structure and a side length "a" equal or slightly larger than the source size and the side walls having an angle $\theta_G$' calculated from the desired angle $\theta_G$ by the Snell's equation sin($\theta_G$')=sin($\theta_G$)/n, where "n" is the refractive index of the material of the block building the optical structure 140. The solid block described above may consist of two parts; the small diffuser 144 (often costly) and a large trapezoidal-mirror block building the optical device 146 (made from cheap injection molded polymer).

Figure 10:
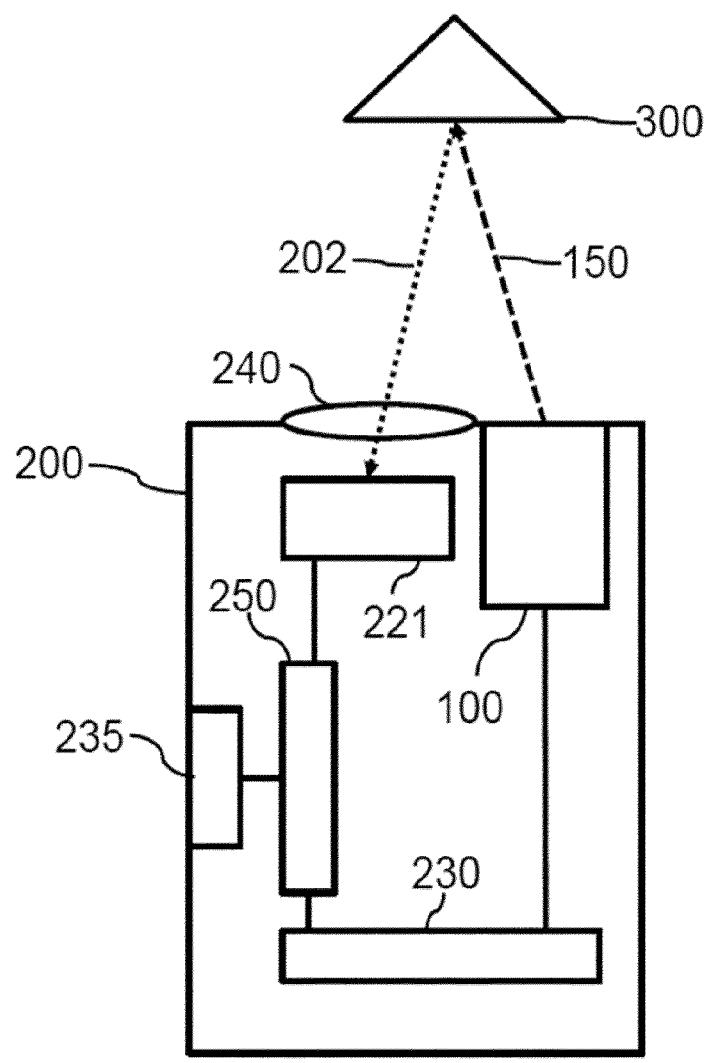
FIG. 10 shows a principal sketch of a time-of-flight sensor module.

FIG. 10 shows a principal sketch of a time-of-flight camera 200. The time-of-flight sensor module 200 comprises a laser arrangement 100 in accordance with one of the embodiments discussed above. The time-of-flight camera 200 further comprises a detector 221 which is arranged to detect very short light pulses. Such short laser pulses may be caused by transformed laser light 150 emitted by the laser arrangement 100 hitting an object 300. A part of the transformed laser light 150 is reflected by the object 300 such that reflected laser light 202 is received by optical device 240 (e.g. lens or lens arrangement) which images the received laser light to detector 221. The reflected laser light 202 causes a corresponding electrical signal in the detector 221. An electrical driver 230 may be arranged to electrically drive the VCSEL array 110 or optionally each VCSEL 130 or sub-groups of VCSELs 130 of the laser arrangement 100 separately. A controller 250 is connected with the electrical driver 230 in order to control, for example, start and stop time of the laser pulse emitted by VCSEL array 110. The controller 250 is further connected with the detector 221 in order to receive the electrical signal(s) caused by the reflected laser light 202 detected by detector 221. The time-of-flight camera 200 further comprises an optional interface 235 to transfer start and stop time of the transformed laser light 150 emitted by the corresponding VCSEL 130 or group of VCSELs 130 as well as time of reception of the electrical signal caused by the reflected laser light 202. The transferred data can be used to calculate the time-of-flight of the laser light 10 and therefore a distance(s) between the time-of-flight camera 200 and the object 300. The time-of-flight camera 200 may alternatively comprise an evaluator (not shown) electrically connected with the controller 250 (or may comprise or be comprised by controller 250) in order to determine the distance(s) to the object. Several distance measurements may be used to determine a velocity or even an acceleration of the object 300.

Figure 11:
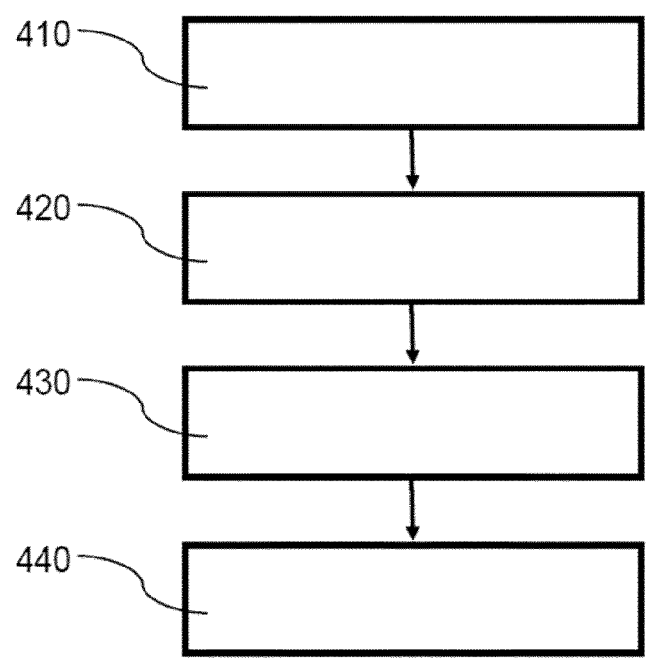
FIG. 11 shows a principal sketch of a process flow of a method of fabricating a VCSEL array.

FIG. 11 shows a principal sketch of a process flow of a method of fabricating a VCSEL array 100. In step 410 a semiconductor substrate 101 is provided. The semiconductor substrate 101 is part of a semiconductor wafer. In the subsequent step 420 a VCSEL array is provided. The VCSEL array 110 comprises a multitude of VCSELs 130 on a first side of the semiconductor substrate 101. Each VCSEL 130 is characterized by an emission cone during operation of the respective VCSEL 130. An optical structure 140 is provided in step 430. The optical structure 140 is adapted or arranged in step 440 to transform laser light emitted by the VCSELs 130 to transformed laser light 150 such that an overlap of laser light 10 comprised by the emission cones of at least a group of the VCSELs 130 is increased in a defined field-of-view.

A variation of an intensity of the defined illumination pattern in % may refer to a ratio of a standard deviation or variance of the intensity in the field-of-view to an average intensity in the field-of-view. A variation of an intensity of the defined illumination pattern in % may refer to a relative difference between a maximum and a minimum intensity of the illumination pattern in the field-of-view. A relative difference may be determined as a different between maximum and minimum values divided by the maximum or minimum.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments. The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 laser light
21 first reference pattern
23 second reference pattern
25 third reference pattern
41 intensity distribution of prior art diffuser defusing perfectly collimated laser light under an angle of 0° with respect to the surface normal of the prior art diffuser
43 intensity distribution of prior art diffuser defusing perfectly collimated laser light under an angle of 10° with respect to the surface normal of the prior art diffuser
51 intensity
53 angle
55 angular extension ($\theta_1$) of field-of-view in one direction
57 $\theta_2/2$ (half divergence angle of laser)
59 $\alpha/2$ (half reduced slope angle)
61 prior art intensity distribution
63 improved intensity distribution
100 laser arrangement
110 laser (e.g. VCSEL) array
101 semiconductor substrate
130 laser (e.g. VCSEL)
135 emission cone of diffused laser light
140 optical structure
141 angular extension
143 angular reduction
144 diffuser 144a first segment
144b second segment
144' prior art diffuser
145 surface normal to light exit area of diffuser
146 optical device
147 h (height of optical device)
148 tilt angle ($\theta_G$)
149 light exit area
150 transformed laser light
200 time of flight camera
202 reflected laser light
221 light detector
230 electrical driver
235 interface
240 optical device
250 controller
300 object
410 step of providing a substrate
420 step of providing VCSEL array
430 step of providing optical structure
440 step of arranging optical structure
$\theta_2$ divergence angle

The invention claimed is:

1. A laser arrangement comprising:
a laser array including a plurality of Vertical Cavity Surface Emitting lasers, each laser emitting laser light in form of an emission cone; and
an optical structure including a diffuser arranged to change a distribution of the laser light, the optical structure being configured to transform the laser light to transformed laser light such that an overlap of the emission cones of at least a group of the plurality of lasers is increased in field-of-view in comparison to perfectly collimated laser light diffused to a flat-top intensity profile in the field-of-view,
wherein the optical structure is arranged to redirect the laser light emitted at angles of the emission cone to the field-of-view so as to increase the overlap of the emitted laser light in the field-of-view such that an intensity of the defined illumination pattern varies in the field-of-view less than 20%;
wherein the optical structure is configured to provide a slope angle $\alpha$ of an intensity profile along a direction of the field-of-view that is smaller than a divergence angle of the laser in the direction of the field-of-view.

2. The laser arrangement according to claim 1, wherein the diffuser is configured to transform the laser light to the transformed laser light.

3. The laser arrangement according to claim 2, wherein each emission cone has a maximum divergence angle, wherein the diffuser is arranged at a distance to a light-emitting surface of each laser such that the emission cones of the laser do not overlap in a plane of the diffuser, and wherein the diffuser comprises at least two different segments per laser, each of the at least two different segments are characterized by a different diffuser structure, and wherein each segment is arranged to direct laser light received by the respective laser segment to the field-of-view.

4. The laser arrangement according to claim 3, wherein each segment of the diffuser is arranged to redirect the laser light received by the respective segment in a direction of a surface normal to a light exit area of the diffuser depending on an angle of the laser light within the respective emission cone with respect to the surface normal such that an overlap of the transformed laser light in the field-of-view is increased.

5. The laser arrangement according to claim 4, wherein each segment of the diffuser is arranged such that a degree of redirection increases with increasing angle of the emitted laser light within the respective emission cone with respect to the surface normal.

6. The laser arrangement according to claim 2, wherein the diffuser is arranged at a distance to light-emitting surfaces of the lasers such that the emission cones of a multitude of lasers overlap, and wherein the diffuser comprises at least two different segments, and wherein each segment is arranged to redirect laser light received by the respective segment to the field-of-view.

7. The laser arrangement according to claim 6, wherein the distance to the light-emitting surfaces of the lasers is such that each segment of the diffuser receives laser light from the laser array within a predefined range of angles with respect a surface normal to a light exit area of the diffuser.

8. The laser arrangement according to claim 1, wherein the optical structure further comprises an optical device, wherein the diffuser is arranged to diffuse the laser light received from the lasers, wherein the diffuser has a light exit area through which the diffused laser light leaves the diffuser, wherein the optical device comprises a light entrance window for receiving the diffused laser light, and wherein the optical device is arranged to redirect the diffused laser light to the field-of-view such that the laser light is transformed to the transformed laser light.

9. The laser arrangement according to claim 8, wherein the optical device comprises tilted mirrors, wherein a tilt angle of the tilted mirrors is defined with respect to the surface normal, wherein the tilt angle is arranged to provide the intensity of the defined illumination pattern.

10. The laser arrangement according to claim 9, wherein each emission cone is characterized by a maximum divergence angle $\theta_2$, wherein an angle of extension of the field-of-view in the direction of the maximum divergence angle $\theta_2$ is given by $\theta_1$, and wherein the tilt angle is given by $\theta_G = \theta_1/2 +/- 5°$ in the direction of the maximum divergence angle $\theta_2$.

11. A light emitting device comprising at least one laser arrangement according to claim 1 and an electrical driver for providing an electrical drive current to the laser arrangement.

12. The laser arrangement according to claim 1, wherein the optical structure is arranged to redirect the laser light emitted at angles of the emission cone to the field-of-view so as to increase the overlap of the emitted laser light in the field-of-view such that an intensity of the defined illumination pattern varies in the field-of-view less than 5%.

13. A method of fabricating a laser arrangement, the method comprising the steps of:
providing a semiconductor substrate,
providing a laser array comprising a multitude of lasers on a first surface of the semiconductor substrate, wherein each laser is characterized by an emission cone,
providing an optical structure,
arranging the optical structure to transform laser light emitted by the lasers to transformed laser light such that an overlap of laser light comprised by the emission cones of at least a group of the lasers is increased in a defined field-of-view in comparison to a diffuser which is arranged to diffuse perfectly collimated laser light to a flat-top intensity profile in the field-of-view, wherein the optical structure is arranged to redirect the laser light emitted at large angles of the emission cone to the field-of-view; wherein the optical structure is arranged to increase the overlap of the emitted laser light in the field-of-view such that an intensity of the defined illumination pattern varies in the field-of-view less than 20%;

wherein the optical structure is arranged to provide a slope angle $\alpha$ of an intensity profile along a direction of the field-of-view, wherein the slope angle $\alpha$ is smaller than a divergence angle of the laser in the direction of the field-of-view.

14. A time-of-flight camera comprising the light emitting device according to claim 13, and a light detector for detecting transformed laser light reflected by an object, and wherein and evaluator is arranged to determine a distance to the object by means of the transformed laser light detected by the light detector.

* * * * *